United States Patent
Chang et al.

(10) Patent No.: US 8,076,214 B2
(45) Date of Patent: Dec. 13, 2011

(54) DISPLAY SUBSTRATE AND METHOD OF MANUFACTURING THE SAME

(75) Inventors: Sun-Young Chang, Bucheon-si (KR); Byoung-Joo Kim, Anyang-si (KR); Sang-Hun Lee, Suwon-si (KR); Gwan-Soo Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 383 days.

(21) Appl. No.: 12/369,242

(22) Filed: Feb. 11, 2009

(65) Prior Publication Data

US 2009/0261333 A1  Oct. 22, 2009

(30) Foreign Application Priority Data

Apr. 21, 2008 (KR) .................................. 2008-36564

(51) Int. Cl.
  *H01L 23/544* (2006.01)
(52) U.S. Cl. ........ 438/401; 438/462; 438/973; 438/975; 257/797; 257/E23.179; 356/139.09; 356/490; 356/508
(58) Field of Classification Search .................. 438/401, 438/462, 975, 116, 668, 70, 68, 69, 66, 67, 438/973, 38; 257/48, 797, E23.179; 356/401, 356/509, 490, 508, 139.09; 349/94, 123, 349/128, 129, 130, 132, 134, 135, 191; 345/651, 345/662, 677, 178; 348/95, 326, 745, 806
See application file for complete search history.

(56) References Cited

U.S. PATENT DOCUMENTS

| | | | |
|---|---|---|---|
| 2002/0028528 A1* | 3/2002 | Ohtaka | 438/48 |
| 2004/0195704 A1* | 10/2004 | Nakata et al. | 257/797 |
| 2005/0079331 A1* | 4/2005 | Ikeda et al. | 428/209 |
| 2005/0117093 A1* | 6/2005 | Kim et al. | 349/106 |
| 2005/0161836 A1* | 7/2005 | Yudasaka et al. | 257/797 |
| 2006/0060858 A1* | 3/2006 | Park et al. | 257/66 |
| 2007/0155083 A1* | 7/2007 | Park | 438/199 |

FOREIGN PATENT DOCUMENTS

| | | |
|---|---|---|
| JP | 2004031603 A | 1/2004 |
| KR | 1020030011985 A | 2/2003 |
| KR | 1020030058214 A | 7/2003 |

* cited by examiner

*Primary Examiner* — Cuong Q Nguyen
*Assistant Examiner* — Yosef Gebreyesus
(74) *Attorney, Agent, or Firm* — Cantor Colburn LLP

(57) ABSTRACT

A display substrate includes a signal line, a thin-film transistor ("TFT"), a key pattern, a light-blocking pattern, a color filter, a pixel electrode and an alignment key. The signal line and the key pattern are formed on a substrate. The TFT is electrically connected to the signal line. The light-blocking pattern is formed on the substrate and covers the signal line, the TFT and the key pattern. The color filter is formed in a unit pixel area of the substrate. The pixel electrode is formed on the color filter and is electrically connected to the TFT. The alignment key is formed on the light-blocking pattern, and a position of the alignment key on the substrate corresponds to a position of the key pattern on the substrate.

16 Claims, 10 Drawing Sheets

DISPLAY SUBSTRATE AND METHOD OF MANUFACTURING THE SAME

This application claims priority to Korean Patent Application No. 2008-36564, filed on Apr. 21, 2008, and all the benefits accruing therefrom under 35 U.S.C. §119, the contents of which in its entirety are herein incorporated by reference.

BACKGROUND OF THE INVENTION

1. Field of the Invention

The present invention relates to a display substrate and a method of manufacturing the display substrate. More particularly, the present invention relates to a display substrate used in a liquid crystal display device and a method of manufacturing the display substrate.

2. Description of the Related Art

A liquid crystal display ("LCD") device typically includes a first substrate having a thin-film transistor ("TFT") and a pixel electrode, a second substrate facing the first substrate and a liquid crystal layer interposed between the first substrate and the second substrate.

The second substrate generally includes a color filter disposed at a position corresponding to a position of the pixel electrode on the first substrate. In addition, the second substrate typically includes a light-blocking pattern formed at a periphery of the color filter between pixel electrodes of a plurality of the pixel electrodes. However, in a color filter on array ("COA") type LCD device which has recently been developed, a first substrate thereof includes a color filter and a light-blocking pattern (instead of these components being disposed on a second substrate thereof).

In a manufacturing process in which the light-blocking pattern of the first substrate in the COA type LCD device is formed, a key pattern is first formed on a substrate. Then, a light-blocking layer is formed on the key pattern to cover the key pattern. After the light-blocking layer is formed on the key pattern, an exposure apparatus is aligned above the substrate using the key pattern, and the light-blocking layer is then patterned to form the light-blocking pattern using the exposure apparatus.

When the exposure apparatus is aligned on the substrate, the position of the key pattern must be accurately detected. To this end, the exposure apparatus may detect a position of the key pattern based on light reflected by the key pattern. However, as the key pattern is covered by the light-blocking layer, a recognition rate of the key pattern by the exposure apparatus is reduced, since the light-blocking layer has a low reflection ratio.

BRIEF SUMMARY OF THE INVENTION

Exemplary embodiments of the present invention provide a display substrate having an enhanced recognition rate of a key pattern thereof.

Exemplary embodiments of the present invention also provide a method of manufacturing the display substrate having the enhanced recognition rate of the key pattern.

According to an exemplary embodiment of the present invention, a display substrate includes a signal line, a thin-film transistor ("TFT"), a key pattern, a light-blocking pattern and an alignment key. The signal line is formed on a substrate. The TFT is electrically connected to the signal line. The key pattern is formed on the substrate. The light-blocking pattern is formed on the substrate to cover the signal line, the TFT and the key pattern. The alignment key is formed on the light-blocking pattern, and a position of the alignment key on the substrate corresponds to a position of the key pattern on the substrate.

In an exemplary embodiment of the present invention, the alignment key is an alignment metal part formed on the light-blocking pattern to cover the key pattern. A thickness of the alignment metal part may have a range of approximately 1000 Å to approximately 3,000 Å. The alignment metal part may have reflective properties, e.g., may be configured to reflect light.

In an alternative exemplary embodiment of the present invention, the alignment key may be an alignment groove formed in the light-blocking pattern to expose the key pattern therethrough. In addition, the key pattern may have reflective properties, e.g., may reflect light.

The key pattern may include a material substantially the same as a material of a data line of the signal lines.

According to an alternative exemplary embodiment of the present invention, there is provided a method of manufacturing a display substrate. The method includes: forming a signal line, a thin-film transistor electrically connected to the signal line, and a key pattern on a substrate; forming a light-blocking layer on the substrate to cover the signal line, the thin-film transistor and the key pattern; forming an alignment key on the light-blocking layer, a position of the alignment key on the light-blocking layer corresponding to a position of the key pattern on the substrate; aligning an exposure apparatus above the substrate using the alignment key; patterning the light-blocking layer using the exposure apparatus to form a light-blocking pattern on the substrate.

In an exemplary embodiment of the present invention, the alignment key may be an alignment metal part formed on the light-blocking pattern to cover the key pattern. Further, the alignment metal part may be formed on the light-blocking layer by a chemical vapor deposition ("CVD") repair apparatus.

Alternatively, the alignment key may be an alignment groove formed through the light-blocking pattern to expose the key pattern therethrough. The alignment groove may be formed by removing a portion of the light-blocking layer by a laser repair apparatus.

In an exemplary embodiment of the present invention, the method may further includes forming a color filter in a unit pixel area of the substrate, forming a pixel electrode electrically connected to the thin-film transistor on the color filter. The substrate may include a display area and a peripheral area. The display area may include the signal line, the TFT, the color filter and the pixel electrode formed therein. The peripheral area may substantially surround an outer periphery of the display area. The peripheral area may have the key pattern formed therein. Further, a boundary line between the display area and the peripheral area defines the outer periphery of the display area. The method may further include cutting the substrate along the boundary line.

In an exemplary embodiment of the present invention, the method may further include forming a plurality of the key patterns on the substrate. The outer periphery of the display area may have a rectangular shape. Key patterns of the plurality of key patterns may have a rectangular shape and may be formed proximate to four opposite corners of the outer periphery of the display area. The key patterns may be formed in the peripheral area. Alternatively, the key patterns may be formed in the display area.

The forming the color filter may be performed before the forming the light-blocking layer. The forming the color filter may include forming a color filter layer on the substrate to cover the signal line, the TFT and the key pattern and patterning the color filter layer to form the color filter. The patterning the color filter layer may include aligning a mask on the substrate using the key pattern.

Alternatively, the forming the color filter may be performed after the forming light-blocking pattern. The forming the color filter may include: jetting a color filter ink into the unit pixel area on an area of the substrate on which the light-blocking pattern is not formed; and drying the color filter ink to form the color filter.

According to exemplary embodiments of the present invention, an alignment key is formed on a light-blocking layer covering a key pattern at a position corresponding to the key pattern on a substrate, and an exposure apparatus may thereby accurately detect a position of the key pattern using the alignment key. Thus, a recognition rate of the key pattern for the exposure apparatus is substantially enhanced by an alignment metal part formed on the light-blocking layer or, alternatively, an alignment groove formed through the light-blocking layer.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

Figure 1:
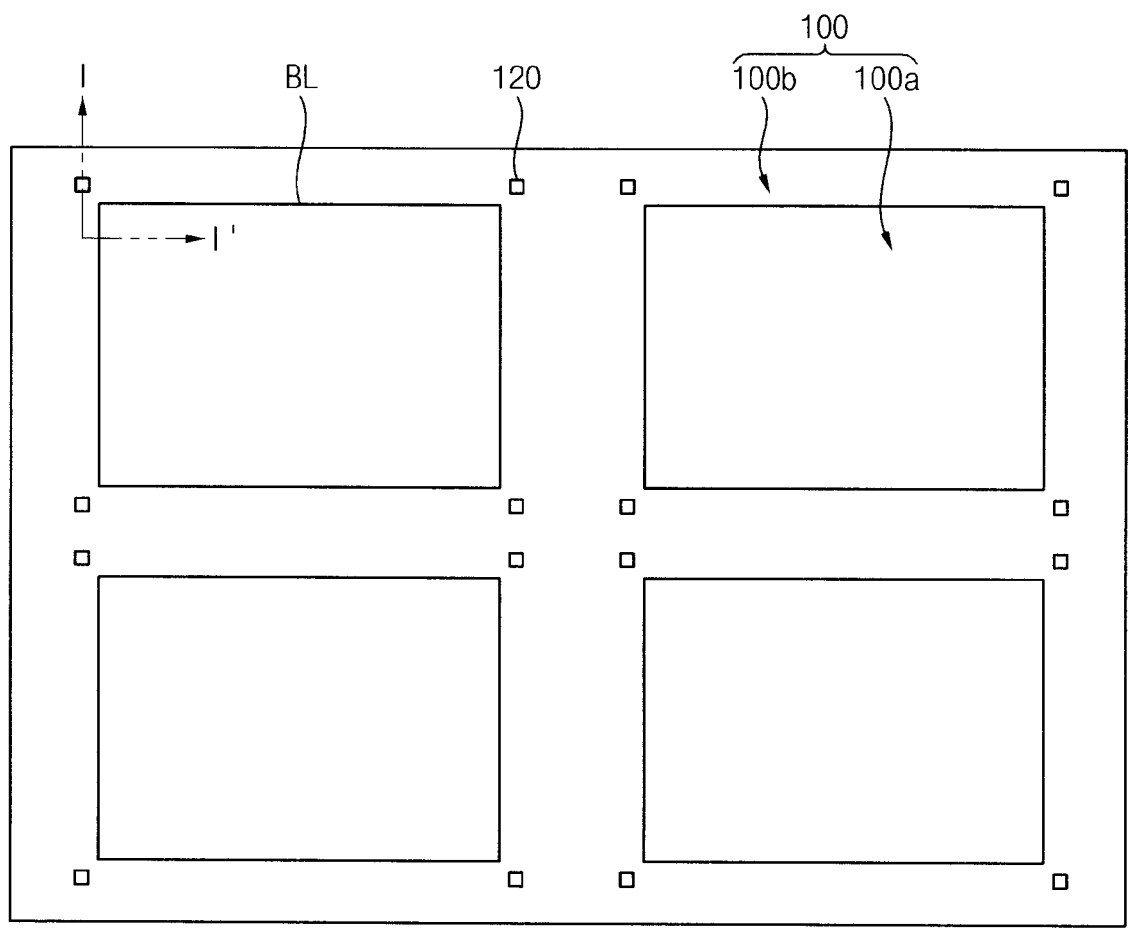
FIG. 1 is a plan view illustrating a step for forming a key pattern on a mother substrate in a method for manufacturing a display substrate in accordance with an exemplary embodiment of the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, exemplary embodiments of the present invention will be described in further detail with reference to the accompanying drawings.

Figure 2:
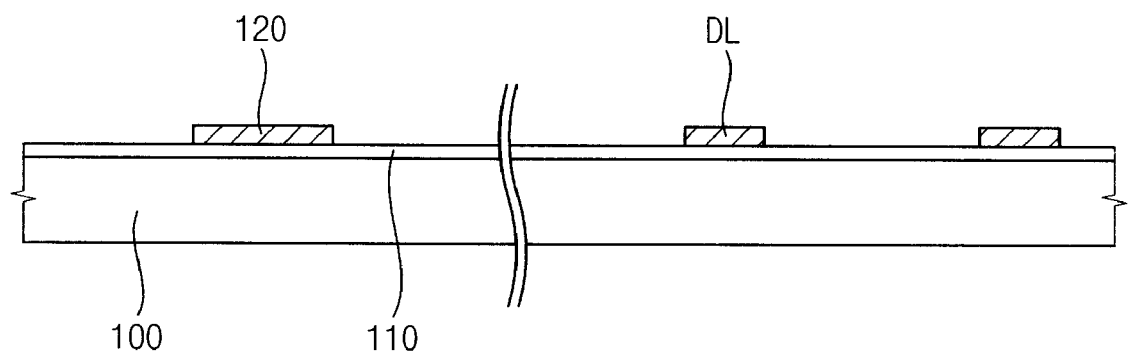
FIG. 2 is a partial cross-sectional view taken along line I-I' of FIG. 1.
Figure 3:
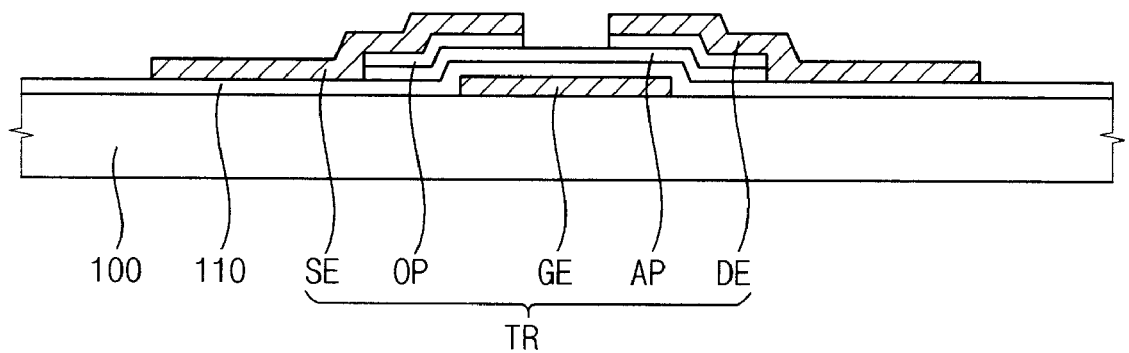
FIG. 3 is a partial cross-sectional view illustrating a thin-film transistor ("TFT") formed on the mother substrate of the display substrate according to the exemplary embodiment of the present invention shown in FIG. 1.

FIG. 1 is a plan view illustrating a step for forming a key pattern on a mother substrate in a method for manufacturing a display substrate in accordance with an exemplary embodiment of the present invention. FIG. 2 is a partial cross-sectional view taken along line I-I' of FIG. 1. FIG. 3 is a partial cross-sectional view illustrating a thin-film transistor ("TFT") formed on the mother substrate of the display substrate according to the exemplary embodiment of the present invention shown in FIG. 1.

Referring to FIGS. 1 to 3, in a method of manufacturing a display substrate of the present embodiment, a key pattern 120, signal lines and a TFT TR are formed on a mother substrate 100. Here, the signal lines include a gate line (not shown) and a data line DL. The TFT includes a gate electrode GE, an active pattern AP, an ohmic contact pattern OP, a source electrode SE and a drain electrode DE.

The mother substrate 100 includes at least one display area 100a and a peripheral area 110b formed in the periphery of the display area 100a. A boundary line BL divides the display area 100a from the peripheral area 110b. In an exemplary embodiment of the present invention, for example, the mother substrate 100 includes four display areas 110a each having a substantially rectangular shape, as shown in FIG. 1, but alternative exemplary embodiments are not limited thereto.

Hereinafter, a process in which the key pattern 120, the signal line and the TFT TR are formed will be described in further detail with reference to FIGS. 1 to 3.

A gate metal layer (not fully shown) is formed on the mother substrate 100, and then the gate metal layer is patterned to form the gate line (not shown) and the gate electrode GE.

In an exemplary embodiment, the gate line extends along a first direction, e.g., a substantially horizontal direction as viewed in FIG. 1, on the mother substrate 100. In an exemplary embodiment, the gate electrode GE is formed separate from the gate line. In an alternative exemplary embodiment of the present invention, however, the gate electrode GE may be a portion of the gate line.

A gate insulation layer 110 is formed on the mother substrate 100 to substantially cover the gate line and the gate electrode GE. The gate insulation layer 110 according to an exemplary embodiment may include silicon oxide ("SiOx") or silicon nitride ("SiNx"), but alternative exemplary embodiments are not limited thereto.

An active layer (not fully shown) and an ohmic contact layer (not fully shown) are then formed on the gate insulation layer 110, and the active layer and the ohmic contact layer are thereafter patterned to form the active pattern AP and the ohmic contact pattern OP, respectively.

As shown in FIG. 3, the active pattern AP is formed on the gate insulation layer 120 and overlaps at least a portion of the gate electrode GE. The ohmic contact pattern OP is formed on the active pattern AP. In an exemplary embodiment, for example, the active pattern AP includes amorphous silicon ("a-Si"), and the ohmic contact pattern OP includes n+ amorphous silicon ("n+ a-Si"), but alternative exemplary embodiments of the present invention are not limited thereto. In the n+ a-Si according to an exemplary embodiment, N-type dopants are doped into the n+ amorphous silicon (n+ a-Si) of the ohmic contact pattern OP at a high concentration.

Next, a data metal layer (not fully shown) is formed on the gate insulation layer 110 to cover at least a portion of each of the active pattern AP and the ohmic contact pattern OP. Then, the data metal layer is patterned to form the key pattern 120, the data line DL, the source electrode SE and the drain electrode DE.

In an exemplary embodiment, the key pattern 120 is formed in the peripheral area 100b of the mother substrate 100, as shown in FIG. 1, but alternative exemplary embodiments are not limited thereto, as will be described in further detail below with reference to FIG. 10. In an exemplary embodiment of the present invention, for example, the key pattern 120 is formed at adjacent portions of four opposing peripheral corners of the display area 100a having the substantially rectangular shape.

The key pattern 120 may have a substantially rectangular shape, as viewed in the plan view of FIG. 1. More specifically, for example, the key pattern 120 according to an exemplary embodiment may have a substantially square shape having sides with lengths of approximately 100 µm each, but alternative exemplary embodiments are not limited thereto.

The data line DL extends along a second direction substantially perpendicular to and crossing the first direction in the display area 100*a* of the mother substrate 100.

The source electrode SE extends from the data line DL, and a portion of the source electrode SE is formed on the ohmic contact pattern OP, as shown in FIG. 3. The drain electrode DE is spaced apart from the source electrode SE, and a portion of the drain electrode DE is formed on the ohmic contact pattern OP.

Next, the ohmic contact pattern OP is patterned using the source electrode SE and the drain electrode DE as a mask to divide the ohmic contact portion OP into two opposing portions thereof.

In an alternative exemplary embodiment, the active layer, the ohmic contact layer and the data metal layer may be sequentially formed on the gate insulation layer 110, and then the data metal layer, the active layer and the ohmic contact layer may be patterned through an etch-back process.

Figure 4:
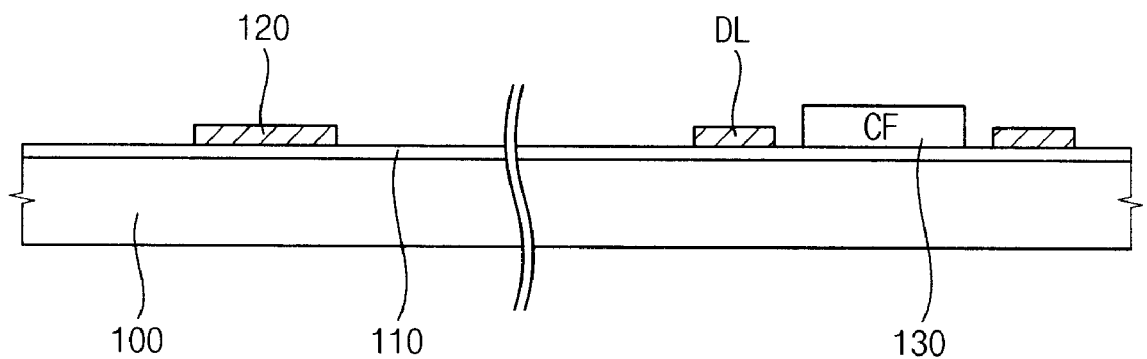
FIG. 4 is a partial cross-sectional view illustrating a step for forming a color filter in a unit pixel of the mother substrate of the display substrate according to the exemplary embodiment of the present invention shown in FIG. 1.

FIG. 4 is a partial cross-sectional view illustrating a step for forming a color filter in a unit pixel of the mother substrate of the display substrate according to the exemplary embodiment of the present invention shown in FIG. 1.

Referring to FIG. 4, a color filter ("CF") layer (not fully shown) is formed on the gate insulation layer 110 to cover at least a portion of the key pattern 120, the data line DL and the TFT TR. Next, the color filter layer is patterned to form a color filter 130. In an exemplary embodiment of the present invention, the color filter 130 is formed in an area corresponding to a unit pixel of the display area 100*a* of the mother substrate 100.

In an exemplary embodiment of the present invention, the color filter layer includes a negative photoresist material. When the color filter layer is a negative photoresist material, a portion of the color filter layer exposed by an exposure apparatus (described in further detail below) is cured. Then, a portion of the color filter layer, e.g., the portion which is not cured, is removed by an etching solution (not shown) to form the color filter 130.

The color filter layer in an exemplary embodiment of the present invention is patterned using the key pattern 120 at a predetermined position on the mother substrate 100. In an exemplary embodiment, when the exposure apparatus exposes a portion of the color filter layer, a mask of the exposure apparatus is thereafter aligned on the mother substrate 100 corresponding to the key pattern 120.

The color filter 130 according to an exemplary embodiment may include, for example, a red color filter, a green color filter and a blue color filter. More specifically, in an exemplary embodiment of the present invention, a red color filter layer is formed, and then the red color filter layer is patterned to form the red color filter. Then, a green color filter layer is formed on the entire surface of the resultant structure including the red color filter, and then the green color filter layer is patterned to form the green color filter. Then, a blue color filter layer is formed on the entire surface of the resultant structure including the red color filter and the green color filter, and then the blue color filter layer is patterned to form the blue color filter.

Further, the key pattern 120 according to an exemplary embodiment includes a red color key pattern, a green color key pattern, a blue color key pattern and a light-blocking key pattern. Thus, the red color key pattern is used when the red color filter layer is patterned, and the green color key pattern is used when the green color filter layer is patterned. The blue color key pattern is then used when the blue color filter layer is patterned, and the light-blocking key pattern is used when a light-blocking layer (described in further detail below) is patterned.

In an exemplary embodiment, however, the light-blocking layer key pattern may be omitted. When the light-blocking layer key pattern is omitted, at least one of the red, green and blue color key patterns functions as the omitted light-blocking layer key pattern. For example, the green color key pattern may perform the function of the light-blocking layer key pattern when the light-blocking layer key pattern is not included.

Figure 5:
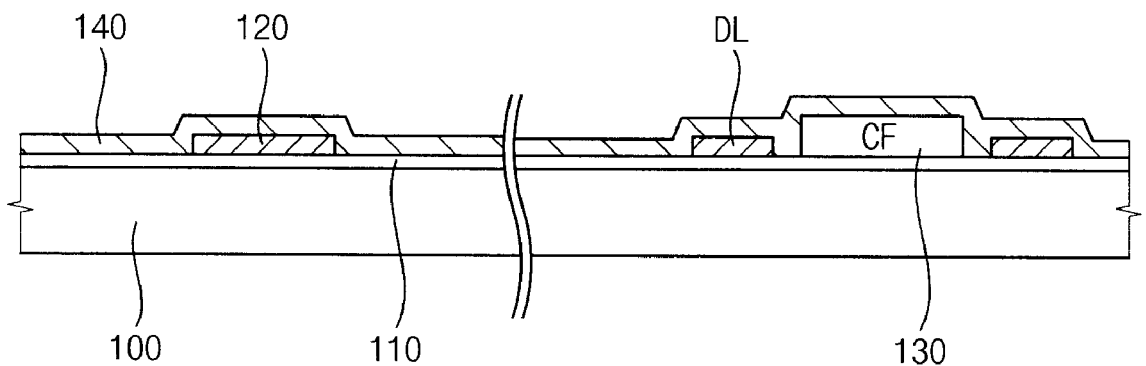
FIG. 5 is a partial cross-sectional view illustrating a step for forming a light-blocking layer covering the key pattern of the display substrate according to the exemplary embodiment of the present invention shown in FIG. 4.

FIG. 5 is a partial cross-sectional view illustrating a step for forming a light-blocking layer covering the key pattern 120 of the display substrate according to the exemplary embodiment of the present invention shown in FIG. 4.

Referring to FIG. 5, a light-blocking layer 140 is formed on the gate insulation layer 110 to cover at least a portion of the key pattern 120, the data line DL, the color filter 130 and the TFT TR.

In an exemplary embodiment of the present invention, the light-blocking layer 140 includes a negative photoresist material. More specifically, for example, the light-blocking layer 140 according to an exemplary embodiment may include a solvent material, a binder material, an initiator material and a monomer material, but alternative exemplary embodiments of the present invention are not limited thereto.

In an exemplary embodiment of the present invention, the solvent material may have a property which promotes gasification, and the binder material may be a material which forms a main structure of the light-blocking layer 140. Further, the initiator material may have properties which cause reactions with the monomer material when light is irradiated thereon, and the monomer material may thereby form chains between materials of the binder material when reacting with the initiator material. Thus, the monomer material forms a chain between the binder materials, curing the binder material to form the light-blocking layer 140.

The light-blocking layer 140 according to an exemplary embodiment of the present invention includes carbon black, for example, which blocks light transmission through the light-blocking layer 140. In addition, an optical density of the light-blocking layer 140 according to an exemplary embodiment, is greater than approximately four (4), for example.

Figure 6:
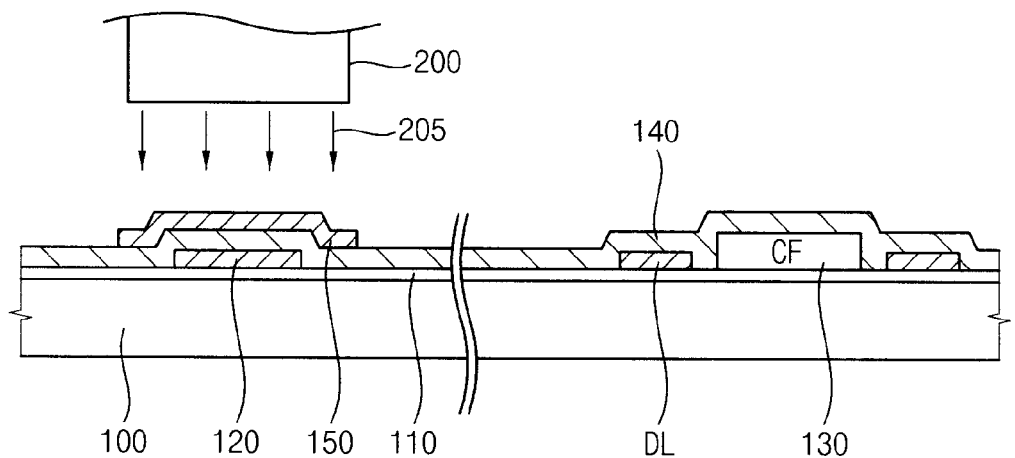
FIG. 6 is a partial cross-sectional view illustrating a step for forming an alignment key on the light-blocking layer of the display substrate according to the exemplary embodiment of the present invention shown in FIG. 5.

FIG. 6 is a partial cross-sectional view illustrating a step for forming an alignment key on the light-blocking layer 140 of the display substrate according to the exemplary embodiment of the present invention shown in FIG. 5.

Referring to FIG. 6, an alignment key 150 is formed on the light-blocking layer 140 to correspond with a position of the key pattern 120.

The alignment key 150 according to an exemplary embodiment of the present invention may be an alignment metal part 150 formed on the light-blocking layer 140 to cover at least a portion of the key pattern 120. The alignment metal part 150 may have a size sufficient to fully cover the key pattern 120, as shown in FIG. 6.

A thickness of the alignment metal part 150 according to an exemplary embodiment may be in a range from approximately 1,000 Å to approximately 3,000 Å. Further, the alignment metal part 150 includes a reflective property. For example, the alignment metal part 150 according to an exemplary embodiment of the present invention may include aluminum (Al) and/or molybdenum (Mo), but alternative exemplary embodiments are not limited thereto.

The alignment metal part 150 according to an exemplary embodiment is formed on the light-blocking layer 140 with a chemical vapor deposition ("CVD") repair apparatus 200, as shown in FIG. 6. In an exemplary embodiment, the CVD repair apparatus 200 is an apparatus which deposits a metal material, for example, at a predetermined position on the mother substrate 100 using a CVD process or method. For example, the CVD repair apparatus 200 may be a laser CVD repair apparatus 200 which deposits a metal material on a portion of the mother substrate 100 onto which a laser beam 205 is irradiated thereon.

Figure 7:
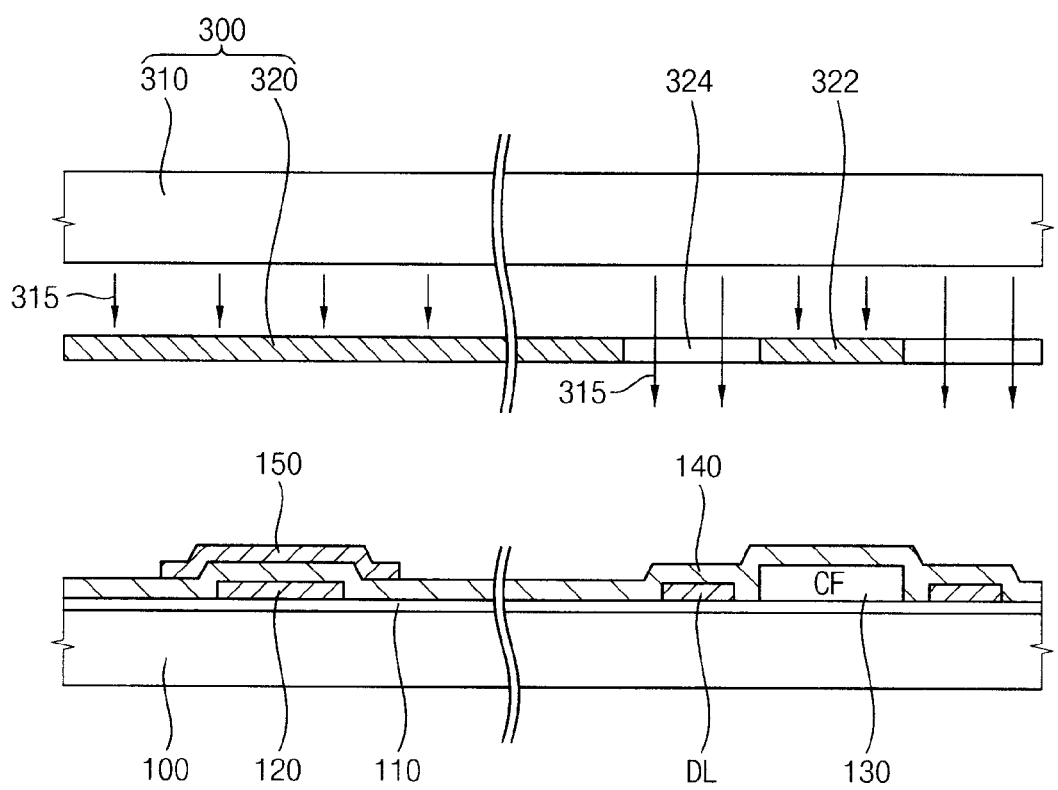
FIG. 7 is a partial cross-sectional view illustrating a step for exposing a light-blocking layer using the alignment key of the display substrate according to the exemplary embodiment of the present invention shown in FIG. 6.

FIG. 7 is a partial cross-sectional view illustrating a step for exposing the light-blocking layer 140 using the alignment key 150 of the display substrate according to the exemplary embodiment of the present invention shown in FIG. 6.

Referring to FIG. 7, an exposure apparatus 300 is aligned on the mother substrate 100 using the alignment key 150, and then the light-blocking layer 140 is exposed by using the exposure apparatus 300.

The exposure apparatus 300 according to an exemplary embodiment includes a light-generating part 310 which generates light 315 and a mask 320 disposed below the light-generating part 310, e.g., disposed between the mother substrate 100 and the light-generating part 310. The light 315 generated by the light-generating part 310 includes ultraviolet ("UV") rays or, alternatively, infrared ("IR") rays. The mask 320 may include a light-blocking area 322 blocking light 315 and a light-transmitting area 324 transmitting the light 315 therethrough.

The exposure apparatus 300 senses the light 315 reflected by the alignment key 150 to detect a position of the alignment key 150 on the mother substrate 100, and a position of the key pattern 120 may thereby be indirectly detected. Thus, the exposure apparatus 300 aligns the mask 320 above the mother substrate 100 based on the position of the alignment key 150 sensed by the exposure apparatus 300.

The mask 320 is aligned above the mother substrate 100, and the light-generating part 310 then generates the light 315. The light 315 generated from the light-generating part 310 transmits through the light-transmitting area 324 of the mask 320 to expose a portion of the light-blocking layer 140. In an exemplary embodiment of the present invention, the light-blocking layer 140 is a negative photoresist type, and a portion of the light-blocking layer 140 is thereby cured.

Figure 8:
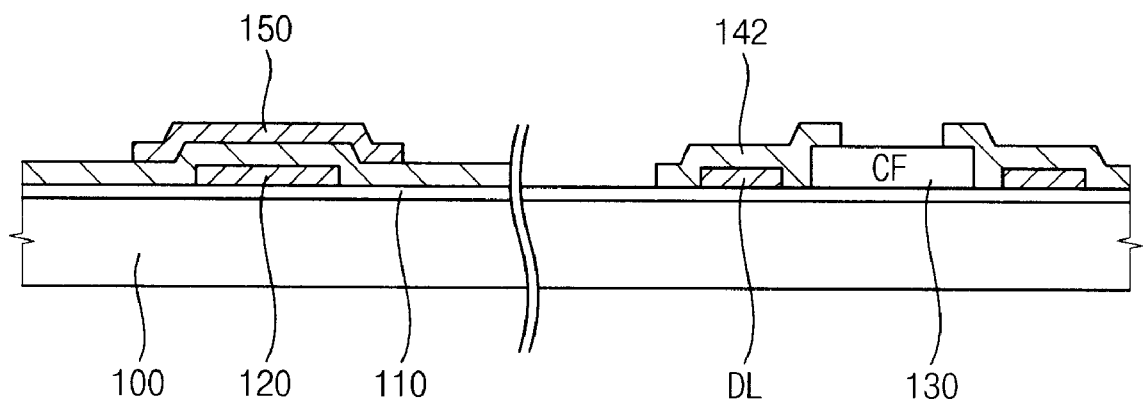
FIG. 8 is a partial cross-sectional view illustrating a step for removing a portion of the light-blocking layer of the display substrate according to the exemplary embodiment of the present invention shown in FIG. 7.

FIG. 8 is a partial cross-sectional view illustrating a step for removing a portion of the light-blocking layer 140 of the display substrate according to the exemplary embodiment of the present invention shown in FIG. 7.

Referring to FIG. 8, a portion of the light-blocking layer 140 not cured by the light 315 is removed using an etching solution, for example, to form a light-blocking pattern 142.

In an exemplary embodiment, the light-blocking pattern 142 covers the data line DL (FIG. 8), the gate line and the TFT TR (FIG. 3). A contact hole (not shown) is formed through the light-blocking pattern 142. The contact hole exposes a portion of the drain electrode DE of the TFT TR. In addition, the light-blocking pattern 142 may be formed at a peripheral edge portion of the color filter 130, as shown in FIG. 8.

Figure 9:
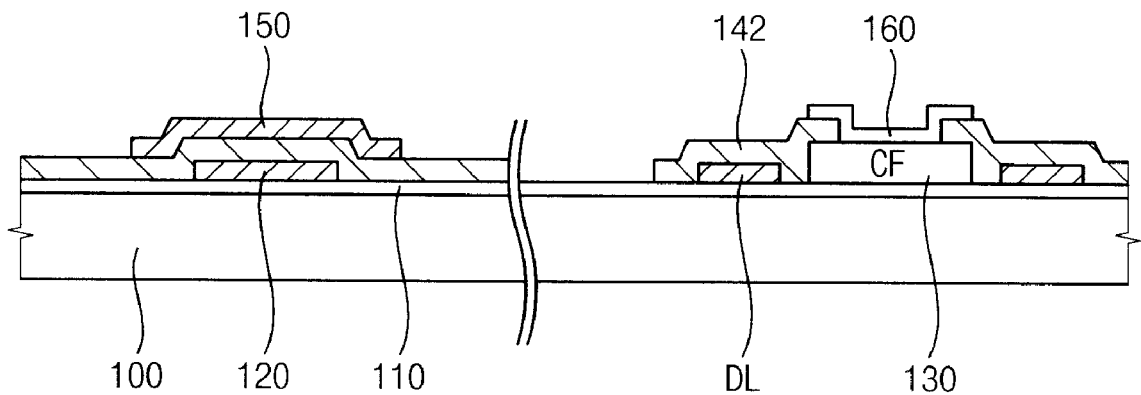
FIG. 9 is a partial cross-sectional view illustrating a step for forming a pixel electrode on the color filter of the display substrate according to the exemplary embodiment of the present invention shown in FIG. 8.

FIG. 9 is a partial cross-sectional view illustrating a step for forming a pixel electrode on the color filter 130 of the display substrate according to the exemplary embodiment of the present invention shown in FIG. 8.

Referring to FIG. 9, a transparent electrode layer (not fully shown) is formed on the gate insulation layer 110 to cover the light-blocking pattern 142 and the color filter 130. Then, the transparent electrode layer is patterned to form a pixel electrode 160.

More specifically, the pixel electrode 160 is formed on the color filter 130, as shown in FIG. 9. In addition, the pixel electrode 160 according to an exemplary embodiment of the present invention may be formed at a peripheral edge portion of the light-blocking pattern 142. The pixel electrode 160 is electrically connected to the drain electrode DE (FIG. 3) through the contact hole (not shown) formed through the light-blocking pattern 142.

Then, an alignment layer (not shown) may be formed on the gate insulation layer 110 to cover the pixel electrode 160 and the light-blocking pattern 142.

The boundary line BL (FIG. 1) between the display area 100a and the peripheral area 110b is then cut to form a display substrate having the display area 100a.

Figure 10:
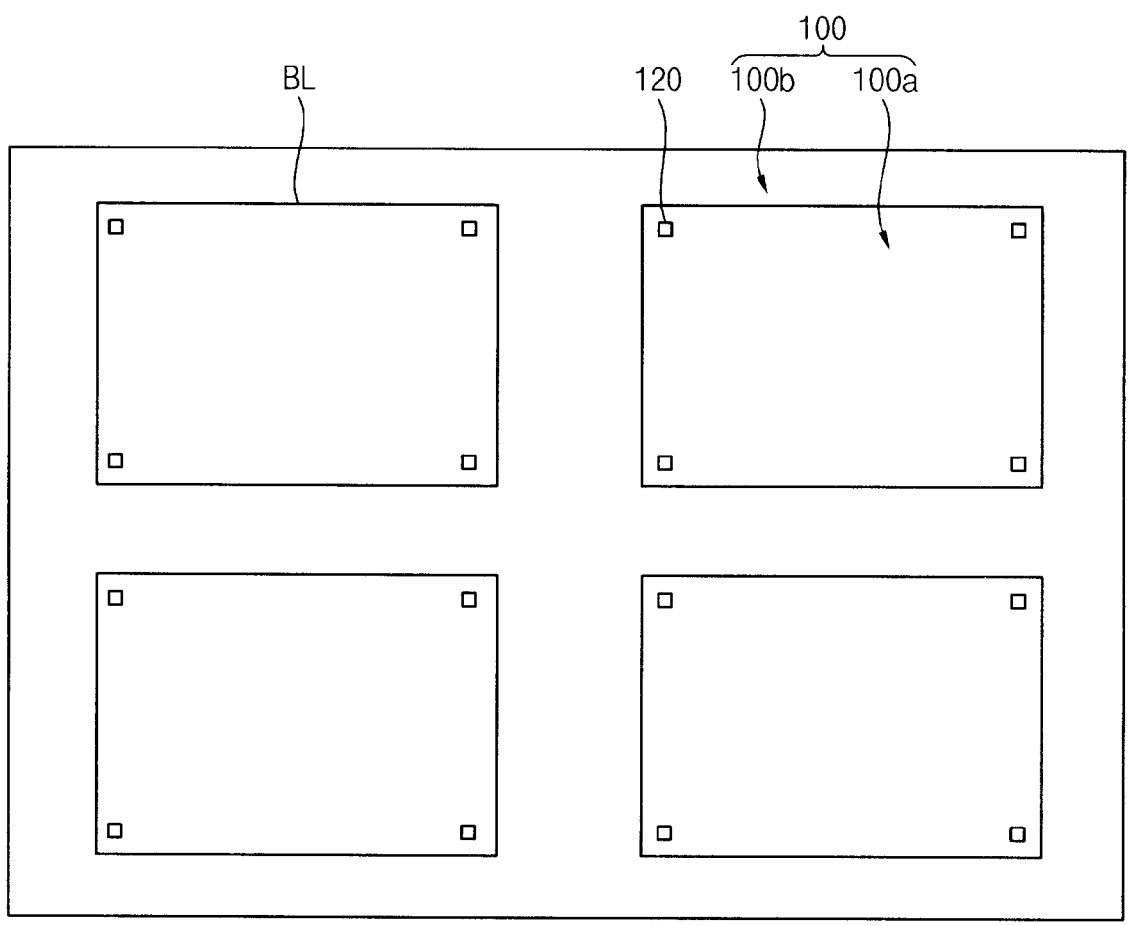
FIG. 10 is a plan view illustrating a key pattern disposed in a display area of the mother substrate according to an alternative exemplary embodiment of the present invention.

FIG. 10 is a plan view illustrating the key pattern 120 disposed in a display area of a mother substrate of according to an alternative exemplary embodiment of the present invention.

Referring to FIGS. 9 and 10, the key pattern 120 may be disposed within the display area 100a of the mother substrate 100. More specifically, for example, the key pattern 120 according to an exemplary embodiment may be formed at adjacent portions of four opposite peripheral corners of the display area 100a, as shown in FIG. 10. In addition, the display area 100a according to an exemplary embodiment of the present invention has a substantially rectangular shape, but alternative exemplary embodiments are not limited thereto. In an exemplary embodiment, the key pattern 120 includes substantially the same material as the data line DL.

When the key pattern 120 is disposed within the display area 100a, as shown in FIG. 10, the key pattern 120 remains within the display substrate according to an exemplary embodiment of the present invention when the boundary line BL between the display area 100a and the peripheral area 110b is cut to form the display substrate. Therefore, the display substrate according to an exemplary embodiment of the present invention includes the alignment key 150 disposed to cover the key pattern 120 formed on the gate insulation layer 110 and the key pattern 120 formed on the light-blocking pattern 142.

Figure 11:
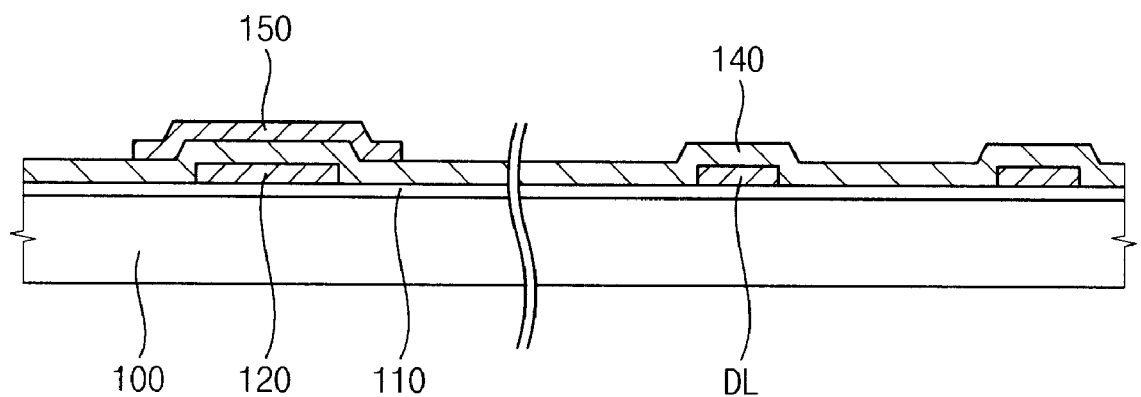
FIG. 11 is a partial cross-sectional view illustrating a step for forming an alignment key on a light-blocking layer in a method for manufacturing a display substrate in accordance with an alternative exemplary embodiment of the present invention.

FIG. 11 is a partial cross-sectional view illustrating a step for forming an alignment key on a light-blocking layer in a method for manufacturing a display substrate in accordance with an alternative exemplary embodiment of the present invention.

Steps, methods, and/or processes for forming a gate insulation layer, a key pattern, a signal line and a TFT of a display substrate according to an exemplary embodiment of the present invention are substantially the same as described in greater detail above with reference to FIGS. 1 to 10, and thus any repetitive detailed explanation will hereinafter be omitted. Likewise, the same reference characters refer to the same or like components.

Referring to FIG. 11, a gate insulation layer 110, a key pattern 120, a signal line and a TFT TR (FIG. 3) are formed on a mother substrate 100. The signal line may include a gate line (not shown) and a data line DL.

Then, a light-blocking layer 140 is formed on the gate insulation layer 110 to cover at least a portion of the key pattern 120, the data line DL and the TFT TR.

The light-blocking layer 140 includes carbon black which blocks light. In an exemplary embodiment of the present invention, for example, an optical density of the light-blocking layer 140 may be greater than approximately four (4).

Then, an alignment key 150 is formed on the light-blocking layer 140 at a position which corresponds with the key pattern 120 on the mother substrate 100.

The alignment key 150 according to an exemplary embodiment may be an alignment metal part 150 formed on the light-blocking layer 140 to cover the key pattern 120. Specifically, the alignment metal part 150 according to an exemplary embodiment has a size which is sufficient to fully cover the key pattern 120, as shown in FIG. 11.

A thickness of the alignment metal part 150 in an exemplary embodiment is in a range from approximately 1,000 Å to approximately 3,000 Å. Further, the alignment metal part 150 may have reflective properties. The alignment metal part 150 according to an exemplary embodiment of the present invention may include aluminum (Al) and/or molybdenum (Mo), for example, but alternative exemplary embodiments are not limited thereto.

The alignment metal part 150 is formed on the light-blocking layer 140 using a CVD repair apparatus 200 (FIG. 6). The CVD repair apparatus 200 may be, for example, a laser CVD repair apparatus 200 which deposits a metal material on a portion of the mother substrate 100 on which a laser beam 205 is thereafter irradiated onto.

Figure 12:
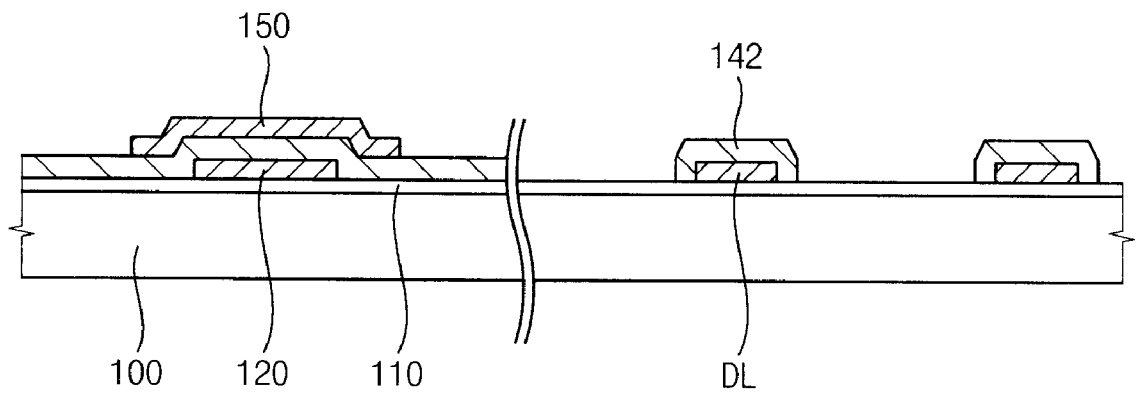
FIG. 12 is a partial cross-sectional view illustrating a step for patterning a light-blocking layer by using the alignment key of the display substrate according to the exemplary embodiment of the present invention shown in FIG. 11.

FIG. 12 is a partial cross-sectional view illustrating a step for patterning the light-blocking layer 140 using the alignment key 120 of the display substrate according to the exemplary embodiment of the present invention shown in FIG. 11.

Referring to FIG. 12, an exposure apparatus 300 (FIG. 7) is aligned on the mother substrate 100 using the alignment key 150, and then the light-blocking layer 140 is exposed by using the exposure apparatus 300.

The exposure apparatus 300 according to an exemplary embodiment may include a light-generating part 310 generating light 315 and a mask 320 disposed below the light-generating part 310, as described in further detail above. The mask 320 may include a light-blocking area 322 which blocks the light 315 and a light-transmitting area 322 which transmits the light 315 therethrough.

The exposure apparatus 300 senses the light 315 reflected by the alignment key 150 to detect a position of the alignment key 150, and a position of the key pattern 120 may thereby be indirectly detected. The exposure apparatus 300 accurately aligns the mask 320 above the mother substrate 100 based on the position of the alignment key 150 sensed by the exposure apparatus 300.

Thus, the mask 320 is accurately aligned above the mother substrate 100, and the light-generating part 310 then generates the light 315. The light 315 generated from the light-generating part 310 transmits through the light-transmitting area 324 of the mask 320 to expose and cure a portion of the light-blocking layer 140.

Then, a portion of the light-blocking layer 140 which is not cured is removed using an etching solution, for example to form a light-blocking pattern 142.

The light-blocking pattern 142 according to an exemplary embodiment of the present invention covers the data line DL, the gate line and the TFT TR (FIG. 3). A contact hole (not shown) may be formed through the light-blocking pattern 142, to expose the drain electrode DE of the TFT TR therethrough.

Figure 13:
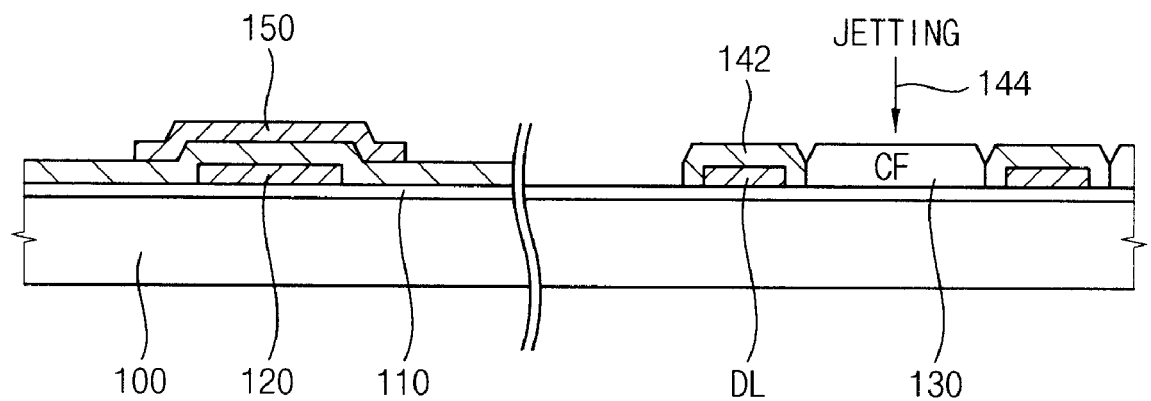
FIG. 13 is a partial cross-sectional view illustrating a step for forming a color filter in a unit pixel of the mother substrate of the display substrate according to the exemplary embodiment of the present invention shown in FIG. 12.

FIG. 13 is a partial cross-sectional view illustrating a step for forming a color filter in a unit pixel of the mother substrate 100 of the display substrate according to the exemplary embodiment of the present invention shown in FIG. 12.

Referring to FIG. 13, after forming the light-blocking pattern 142, a color filter ink 144 is jetted onto the gate insulation layer 110 that the light-blocking pattern 142 is not formed. Specifically, the color filter ink 144 may be formed, by jetting, within a unit pixel in which the light-blocking pattern 142 is not formed, as shown in FIG. 13.

In an exemplary embodiment of the present invention, the color filter ink 144 does not be mix with a color filter ink 144 outside the light-blocking pattern 142, e.g., in an adjacent unit pixel of the mother substrate 100. Specifically, to prevent the color filter ink 144 from flowing into and/or over the light-blocking pattern 142, a surface of the light-blocking pattern 142 includes a hydrophobic property. As a result, affinity of the surface of the light-blocking pattern 142 with the color filter ink 144 is low. In an exemplary embodiment of the present invention, for example, a plasma process is performed on the light-blocking pattern 142 before the color filter ink 144 is jetted, to provide the surface of the light-blocking pattern 142 with the hydrophobic property.

Then, the color filter ink 144 is dried to form a color filter 130. When the color filter ink 144 is dried, a cross-sectional thickness of the color filter ink 144 decreases to form the color filter 130. Specifically, the thickness of the color filter 130 is decreased to be substantially equal to a cross-sectional thickness of the light-blocking pattern 142, as shown in FIG. 13.

As the thickness of the color filter ink 144 decreases during the drying of the color filter ink 144, an upper peripheral surface of the color filter ink 144 is planarized. As a result, the upper peripheral surface of the color filter 130 is planarized.

Figure 14:
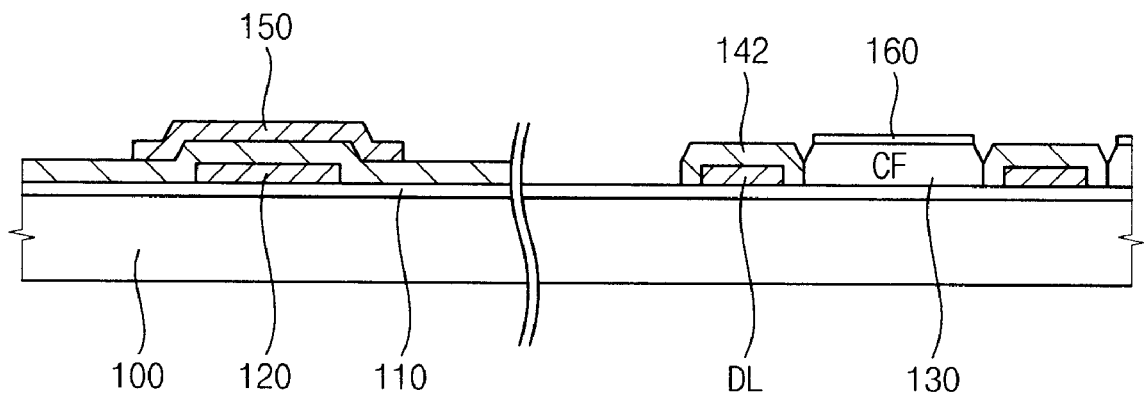
FIG. 14 is a partial cross-sectional view illustrating a step for forming a pixel electrode on the color filter of the display substrate according to the exemplary embodiment of the present invention shown in FIG. 13.

FIG. 14 is a partial cross-sectional view illustrating a step for forming a pixel electrode on the color filter 130 of the display substrate according to the exemplary embodiment of the present invention shown in FIG. 13.

Referring to FIG. 14, a transparent electrode layer (not fully shown) is formed on the gate insulation layer 110 to cover the light-blocking pattern 142 and the color filter 130, and then the transparent electrode layer is thereafter patterned to form a pixel electrode 160.

Specifically, the pixel electrode 160 is formed on the color filter 130. The pixel electrode 160 contacts the drain electrode DE (FIG. 3) through the contact hole formed through the light-blocking pattern 142.

Then, an alignment layer (not shown) may be formed on the gate insulation layer 110 to cover the pixel electrode 160 and the light-blocking pattern 142.

The boundary line BL (FIG. 1) between the display area 100a and the peripheral area 110b is then cut to form the display substrate having the display area 100a according to an exemplary embodiment of the present invention.

Referring to FIGS. 10 and 14, the key pattern 120 according to an exemplary embodiment of the present invention may be disposed within the display area 100a of the mother substrate 100, as described in greater detail above. Thus, when the key pattern 120 is disposed within the display area 100a, the key pattern 120 remains within the display substrate when the boundary line BL between the display area 100a and the peripheral area 110b is cut to form the display substrate according to an exemplary embodiment of the present invention.

Therefore, the display substrate according to an exemplary embodiment includes the alignment key 150 disposed to cover the key pattern 120 formed on the gate insulation layer 110 and the key pattern 120 formed on the light-blocking pattern 142.

Figure 15:
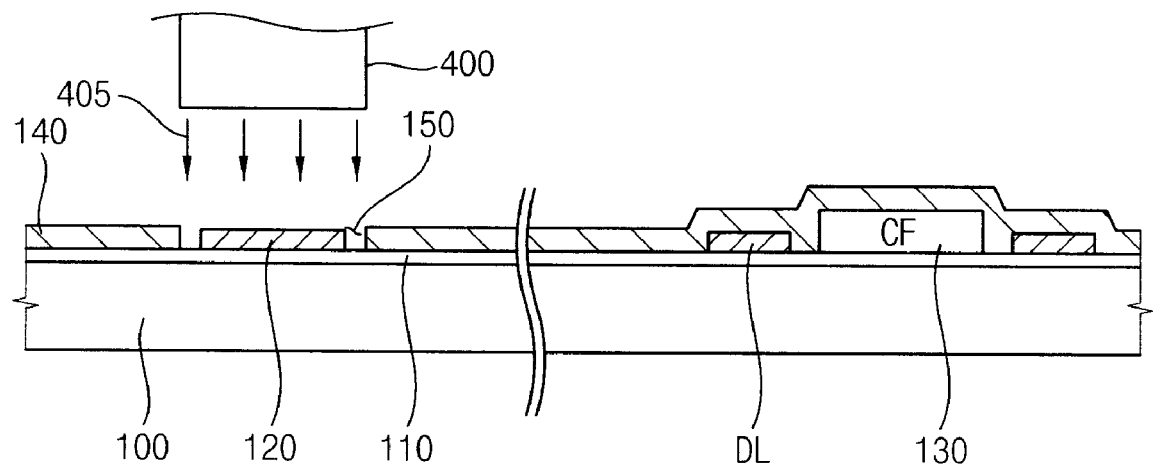
FIG. 15 is a partial cross-sectional view illustrating a step for forming an alignment key on a light-blocking layer in a method for manufacturing a display substrate in accordance with yet another alternative exemplary embodiment of the present invention.

FIG. 15 is a partial cross-sectional view illustrating a step for forming an alignment key on a light-blocking layer in a method for manufacturing a display substrate in accordance with another exemplary embodiment of the present invention.

Steps, methods, and/or processes for forming a gate insulation layer, a key pattern, a signal line and a TFT of a display substrate according to an exemplary embodiment of the present invention are substantially the same as described in greater detail above with reference to FIGS. 1 to 14, and thus any repetitive detailed explanation will hereinafter be omitted. Likewise, the same reference characters refer to the same or like components.

Referring to FIG. 15, a gate insulation layer 110, a key pattern 120, signal lines and a TFT TR (FIG. 3) are formed on a mother substrate 100. The signal lines include a gate line (not shown) and a data line DL.

Then, a color filter layer (not fully shown) is formed on the gate insulation layer 110 to cover the key pattern 120, the data line DL and the TFT TR. The color filter layer is then patterned to form a color filter 130. The color filter 130 is formed within a unit pixel of the display area 100a (FIGS. 1 and 10) of the mother substrate 100. The color filter layer according to an exemplary embodiment includes a negative photoresist material.

The color filter layer is patterned using the key pattern 120 at a predetermined position on the mother substrate 100. In an exemplary embodiment, for example, when an exposure apparatus 300 (FIG. 7) exposes a portion of the color filter layer, a mask 320 of the exposure apparatus 300 is accurately aligned on the mother substrate 100 using the key pattern 120.

Then, a light-blocking layer 140 is formed on the gate insulation layer 110 to cover the key pattern 120, the data line DL, the color filter 130 and the TFT TR.

The light-blocking layer 140 includes a negative photoresist material. In addition, the light-blocking layer 140 further includes carbon black which blocks light. Specifically, an optical density of the light-blocking layer 140 according to an exemplary embodiment of the present invention is greater than approximately four (4).

Then, an alignment key 150 is formed on the light-blocking layer 140 to correspond to a position of the key pattern 120 on the mother substrate 100.

In an exemplary embodiment, the alignment key 150 is an alignment groove 150 formed through the light-blocking layer 140 which covers the key pattern 120. The alignment groove 150 has size which is sufficient to fully cover the key pattern 120, as shown in FIG. 15.

The alignment groove 150 may be formed by removing a portion of the light-blocking layer 140 by laser repair apparatus 400. The laser repair apparatus 400 denotes an apparatus from which a laser beam 405 is irradiated to a silicon layer, a metal wiring, etc., to remove a portion of the silicon layer and the metal wiring. Here, the key pattern 120 is not damaged by the laser repair apparatus 400, when the alignment groove 150 is formed.

Figure 16:
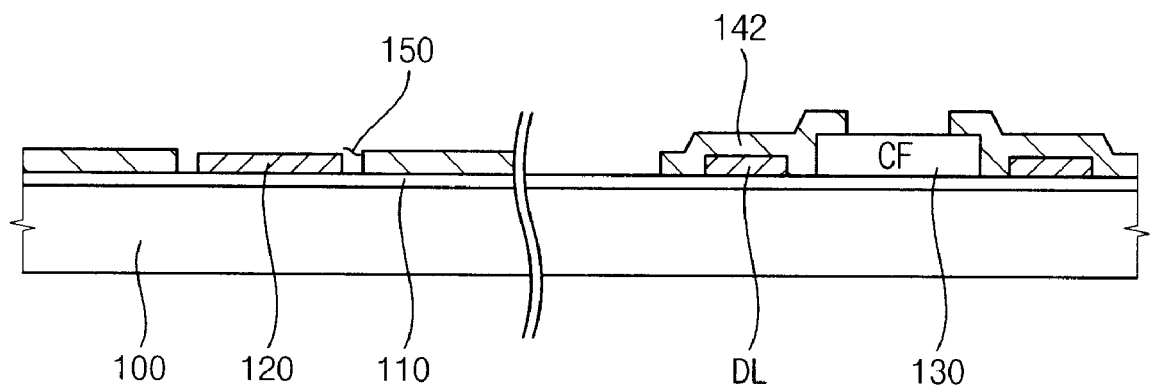
FIG. 16 is a partial cross-sectional view illustrating a step for patterning a light-blocking layer using the alignment key of the display substrate according to the exemplary embodiment of the present invention shown in FIG. 15.

FIG. 16 is a partial cross-sectional view illustrating a step for patterning a light-blocking layer using the alignment groove 150 of the display substrate according to the exemplary embodiment of the present invention shown in FIG. 15.

Referring to FIG. 16, an exposure apparatus 300 (FIG. 7) is aligned on the mother substrate 100 using the key pattern 120 exposed by the alignment groove 150, and then the light-blocking layer 140 is exposed by using the exposure apparatus 300.

The exposure apparatus 300 may include a light-generating part 310 which generates light 315 and the mask 320 disposed below the light-generating part 310. The mask 320 may include a light-blocking area 322 which blocks the light 315 and a light-transmitting area 324 which transmits the light 315 therethrough.

The exposure apparatus 300 senses the light 315 reflected by the key pattern 120 exposed by the alignment groove 150 to detect a position of the key pattern 120. As a result, a position of the key pattern 120 is accurately detected. Thus, the exposure apparatus 300 aligns the mask 320 above the mother substrate 100 based on the position of the alignment key 150 detected by the exposure apparatus 300.

The mask 320 is aligned on the mother substrate 100, and then the light-generating part 310 generates the light 315. The light 315 generated from the light-generating part 310 transmits through the light-transmitting area 320 to expose a portion of the light-blocking layer 140, thereby curing it.

Then, a portion of the light-blocking layer 140 not cured is removed by using an etching solution, for example, to form a light-blocking pattern 142.

The light-blocking pattern 142 according to an exemplary embodiment covers the data line DL, the gate line and the TFT TR (FIG. 3). A contact hole (not shown) which exposes the drain electrode DE of the TFT TR may be formed through the light-blocking pattern 142. Further, the light-blocking pattern 142 according to an exemplary embodiment of the present invention may be formed at a peripheral edge portion of the color filter 130, as shown in FIG. 16.

Figure 17:
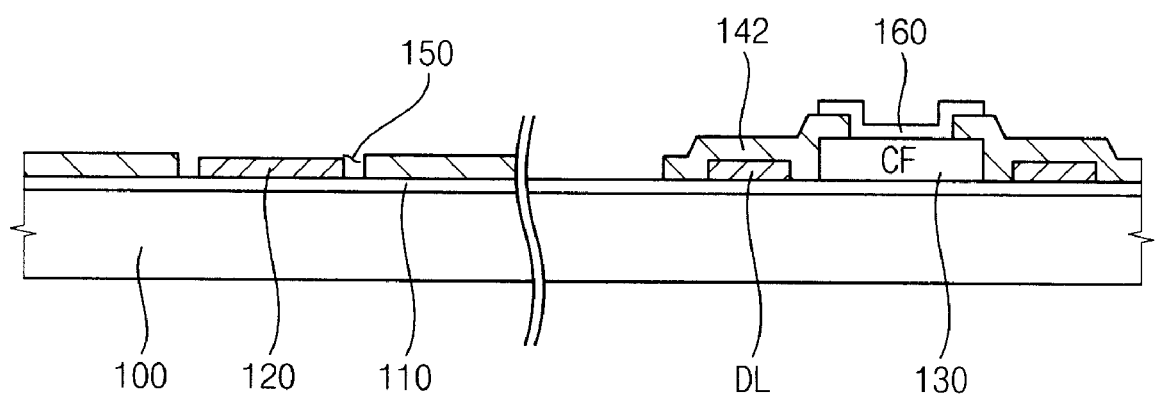
FIG. 17 is a partial cross-sectional view illustrating a step for forming a pixel electrode on a color filter of the display substrate according to the exemplary embodiment of the present invention shown in FIG. 16.

FIG. 17 is a partial cross-sectional view illustrating a step for forming a pixel electrode on a color filter of the display substrate according to the exemplary embodiment of the present invention shown in FIG. 16.

Referring to FIG. 17, a transparent electrode layer (not fully shown) is formed on the gate insulation layer 110 to cover the light-blocking pattern 142 and the color filter 130, and then the transparent electrode layer is patterned to form a pixel electrode 160.

The pixel electrode 160 may be formed on the color filter 130, and the pixel electrode 160 may be formed at a peripheral edge portion of the light-blocking pattern 142, as shown in FIG. 17. Further, the pixel electrode 160 according to an exemplary embodiment of the present invention is electrically connected to the drain electrode DE (FIG. 3) through the contact hole formed through the light-blocking pattern 142.

Then, an alignment layer (not shown) is formed on the gate insulation layer 110 to cover the pixel electrode 160 and the light-blocking pattern 142.

As described in greater detail above, the boundary line BL between the display area 100a and the peripheral area 110b is cut to form the display substrate having the display area 100a according to an exemplary embodiment of the present invention.

Thus, in an exemplary embodiment, the color filter 130 is formed before the light-blocking layer 140 is formed. Alternatively, a color filter ink 144 may be jetted to form the color filter 130 after the light-blocking pattern 142 is formed.

Referring now to FIGS. 10 and 17, the key pattern 120 of an exemplary embodiment is thereby disposed within the display area 100a of the mother substrate 100. Thus, the key pattern 120 remains within the display area 100a when the boundary line BL between the display area 100a and the peripheral area 110b is cut to form the display substrate according to an exemplary embodiment of the present invention.

Therefore, the display substrate includes the key pattern 120 formed on the gate insulation layer 110 and the light-blocking pattern 142 including the alignment key 150 exposing the key pattern 120 therethrough.

Specifically, the alignment key 150 in an exemplary embodiment of the present invention is an alignment groove 150 formed through the light-blocking pattern 142, as described above. The key pattern 120 may have reflective properties to be detected by the exposure apparatus 300 through the alignment groove 150.

According to an exemplary embodiment of the present invention, when the alignment key 150 is formed on a light-blocking layer 140 covering a key pattern 120 at a position corresponding to the key pattern 120, an exposure apparatus 300 accurately detects a position of the key pattern 120 through the alignment key 150.

Thus, as an alignment key 150, e.g., and alignment metal part 150, is formed on the light-blocking layer 140 to correspond with the key pattern 120 or, alternatively, an alignment groove 150 is formed on the light-blocking layer to expose the key pattern 120, the exposure apparatus 300 detects the light 315 reflected by the key pattern 120 exposed by the alignment metal part 150 or, alternatively, the alignment groove 150, so that the position of the key pattern 120 is accurately detected. As a result, a display substrate and manufacturing method the same according to an exemplary embodiment of the present invention have advantages which include, but are not limited to, an enhanced recognition rate of the key pattern 120 thereon.

The foregoing is illustrative of the present invention and is not to be construed as limiting thereof. Thus, the present invention should not be construed as being limited to the exemplary embodiments set forth herein. Rather, these exemplary embodiments are provided so that this disclosure will be thorough and complete and will fully convey the concept of the present invention to those skilled in the art.

While the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A method of manufacturing a display substrate, the method comprising:
   forming a signal line, a thin-film transistor electrically connected to the signal line, and a key pattern on a substrate;
   forming a light-blocking layer on the substrate to cover the signal line, the thin-film transistor and the key pattern;
   forming an alignment key on the light-blocking layer, a position of the alignment key on the light-blocking layer corresponding to a position of the key pattern on the substrate;
   aligning an exposure apparatus above the substrate using the alignment key; and
   patterning the light-blocking layer using the exposure apparatus to form a light-blocking pattern on the substrate.

2. The method of claim 1, wherein the alignment key comprises an alignment metal part covering the key pattern.

3. The method of claim 2, wherein the alignment metal part is formed on the light-blocking layer by a chemical vapor deposition repair apparatus.

4. The method of claim 1, wherein the alignment key comprises an alignment groove formed in the light-blocking pattern to expose the key pattern therethrough.

5. The method of claim 4, wherein the alignment groove is formed by removing a portion of the light-blocking layer using a laser repair apparatus.

6. The method of claim 1, further comprising:
   forming a color filter in a unit pixel area of the substrate; and
   forming a pixel electrode electrically connected to the thin-film transistor on the color filter.

7. The method of claim 6, wherein the substrate comprises:
   a display area including the signal line, the thin-film transistor, the color filter and the pixel electrode formed therein; and
   a peripheral area surrounding an outer periphery of the display area, the peripheral area including the key pattern formed therein.

8. The method of claim 7, wherein
   the substrate further comprises a boundary line defining the outer periphery of the display area, and
   the method further comprises cutting the substrate along the boundary line.

9. The method of claim 7, further comprising forming a plurality of the key patterns on the substrate, wherein
   the outer periphery of the display area has a rectangular shape,
   key patterns of the plurality of key patterns have a rectangular shape, and
   the key patterns are formed proximate to four opposite corners of the outer periphery of the display area.

10. The method of claim 9, wherein the key patterns are formed in the peripheral area.

11. The method of claim 9, wherein the key patterns are formed in the display area.

12. The method of claim 6, wherein the forming the color filter is performed before the forming the light-blocking layer.

13. The method of claim 12, wherein the forming the color filter comprises:
   forming a color filter layer on the substrate to cover the signal line, the thin-film transistor and the key pattern; and
   patterning the color filter layer to form the color filter.

14. The method of claim 13, wherein the patterning the color filter layer comprises:
   aligning a mask on the substrate using the key pattern.

15. The method of claim 6, wherein the forming the color filter is performed after the forming the light-blocking pattern.

16. The method of claim 15, wherein the forming the color filter comprises:
   jetting a color filter ink into the unit pixel area on an area of the substrate on which the light-blocking pattern is not formed; and
   drying the color filter ink to form the color filter.

* * * * *